US010879489B2

(12) United States Patent
Choi et al.

(10) Patent No.: US 10,879,489 B2
(45) Date of Patent: Dec. 29, 2020

(54) ORGANIC DEVICE HAVING PROTECTIVE FILM AND METHOD OF MANUFACTURING THE SAME

(71) Applicant: Korea Advanced Institute of Science and Technology, Daejeon (KR)

(72) Inventors: Kyung Cheol Choi, Daejeon (KR); Yong Min Jeon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/416,576

(22) Filed: May 20, 2019

(65) Prior Publication Data
US 2019/0355931 A1 Nov. 21, 2019

(30) Foreign Application Priority Data

May 21, 2018 (KR) .......................... 10-2018-0057742
Jan. 21, 2019 (KR) .......................... 10-2019-0007536

(51) Int. Cl.
*H01L 51/52* (2006.01)
*H01L 51/00* (2006.01)
*H01L 51/56* (2006.01)

(52) U.S. Cl.
CPC ...... *H01L 51/5253* (2013.01); *H01L 51/0028* (2013.01); *H01L 51/56* (2013.01); *H01L 2251/303* (2013.01); *H01L 2251/558* (2013.01)

(58) Field of Classification Search
CPC .......................... H01L 51/524; H01L 23/3142
See application file for complete search history.

(56) References Cited

U.S. PATENT DOCUMENTS

2003/0034497 A1* 2/2003 Yamazaki ........... H01L 27/3244
257/86
2005/0189857 A1* 9/2005 Kobori .................. H01L 27/322
313/110

(Continued)

FOREIGN PATENT DOCUMENTS

| JP | 2015504579 A | 2/2015 |
| JP | 2015159090 A | 9/2015 |
| KR | 20120138038 A | 12/2012 |

*Primary Examiner* — George R Fourson, III
(74) *Attorney, Agent, or Firm* — The Webb Law Firm

(57) ABSTRACT

The present invention provides a method of manufacturing an organic device having a protective film, the method including: providing bonding layers (adhesives) on one surface of a first substrate and one surface of a second substrate; providing an organic device on the other surface of the first substrate; and providing the second substrate on the organic device such that the bonding layer (adhesive) provided on the second substrate is in contact with the organic device. Since the organic device having the protective film according to the present invention may be attached to other materials through the bonding layer (adhesive), it is not necessary to apply heat in order to attach the organic device to other materials, and as a result, it is possible to attach the organic device to various materials having various shapes regardless of types and shapes of materials. Further, according to the organic device having the protective film according to the present invention, since the protective film is formed as the substrate having the bonding layer (adhesive) 220 is attached to the organic device 300, no heat is applied to the organic device 300 during the process of forming the protective film, and as a result, it is possible to minimize deformation of the organic device 300 by minimizing physical and chemical stress to be applied to the organic device 300. According to the organic device having the protective film according to the present invention, the (Continued)

two protective film layers for protecting the organic device are manufactured through the same process, and as a result, it is possible to innovatively reduce the process time required to manufacture the organic device having the protective film in comparison with the process in the related art.

15 Claims, 24 Drawing Sheets

(56) References Cited

U.S. PATENT DOCUMENTS

| | | | | |
|---|---|---|---|---|
| 2006/0100299 A1* | 5/2006 | Malik | ................... | C08G 59/18 |
| | | | | 522/31 |
| 2012/0313508 A1* | 12/2012 | Son | ................... | H01L 51/0024 |
| | | | | 313/504 |
| 2012/0319572 A1 | 12/2012 | Lee et al. | | |
| 2013/0075739 A1* | 3/2013 | Loy | ................... | H01L 21/6835 |
| | | | | 257/60 |
| 2013/0153270 A1* | 6/2013 | Hung | ................... | H05K 1/0277 |
| | | | | 174/254 |
| 2013/0214266 A1* | 8/2013 | Hirase | ................. | H01L 51/5253 |
| | | | | 257/40 |
| 2014/0235742 A1 | 8/2014 | Cho et al. | | |
| 2015/0069376 A1* | 3/2015 | Son | ......................... | B32B 37/12 |
| | | | | 257/40 |
| 2015/0155522 A1* | 6/2015 | Kim | .................... | H01L 51/5253 |
| | | | | 257/40 |
| 2016/0315276 A1* | 10/2016 | Seol | ................... | H01L 51/0097 |
| 2017/0005291 A1* | 1/2017 | Sung | ................... | H01L 51/5253 |
| 2017/0155086 A1* | 6/2017 | Kang | ................. | H01L 27/3262 |
| 2017/0235191 A1* | 8/2017 | Jang | ................. | G02F 1/133617 |
| | | | | 349/64 |
| 2017/0294620 A1* | 10/2017 | Park | ................... | H01L 27/3276 |
| 2017/0317300 A1* | 11/2017 | Nishi | ...................... | B32B 15/18 |
| 2018/0069070 A1* | 3/2018 | Lee | ....................... | H01L 51/5284 |
| 2018/0138257 A1* | 5/2018 | Higano | ............... | H01L 51/0024 |
| 2018/0219174 A1* | 8/2018 | Omata | ...................... | H05B 33/02 |
| 2018/0337367 A1* | 11/2018 | Tomioka | ............. | H01L 51/5253 |
| 2019/0013487 A1* | 1/2019 | Park | ..................... | H01L 51/0097 |
| 2019/0074478 A1* | 3/2019 | Kwon | ................... | H01L 51/5253 |
| 2019/0221780 A1* | 7/2019 | Ishikawa | ............ | H01L 27/3216 |
| 2019/0305251 A1* | 10/2019 | Han | ........................ | H01L 51/56 |
| 2019/0312095 A1* | 10/2019 | Park | ....................... | H05K 1/118 |
| 2020/0020869 A1* | 1/2020 | Kang | ................... | H01L 51/5253 |

* cited by examiner

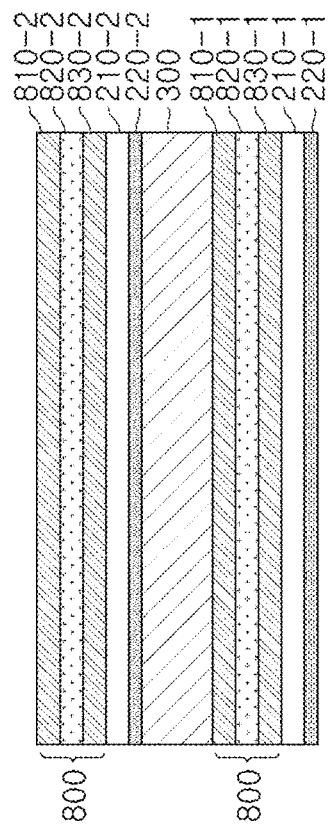
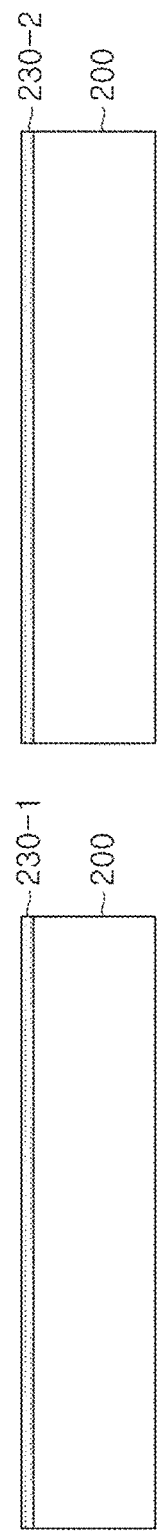
FIG. 11

Free form OLEDs (Regardless of materials & shapes)

OLED OF PRESENT INVENTION

ORGANIC DEVICE HAVING PROTECTIVE FILM AND METHOD OF MANUFACTURING THE SAME

CROSS-REFERENCE TO RELATED APPLICATIONS

This application claims priority to Korean Patent Application No. 10-2018-0057742 filed on May 21, 2018 and Korean Patent Application No. 10-2019-0007536 filed on Jan. 21, 2019, the disclosures of which are hereby incorporated by reference in their entirety.

BACKGROUND OF THE INVENTION

Field of the Invention

The present invention relates to an organic device having a protective film and a method of manufacturing the same, and more particularly, to an organic device having a protective film which is manufactured by a method of providing two substrates each having one surface on which a bonding layer is formed and the other surface on which a encapsulation film layer is formed, and forming the organic device sandwiched between the provided two substrates, and a method of manufacturing the same.

Description of the Related Art

Recently, a display field for visually expressing electrical information signals has been rapidly developed as the information age has come in earnest. Therefore, various flat display devices, which are thin in thickness and light in weight and have excellent performances such as low power consumption, have been developed and are quickly replacing cathode ray tubes (CRTs) in the related art. One example of the flat display devices is an organic light emitting apparatus. The organic light emitting apparatus is an apparatus for displaying an image by using an organic light emitting device that includes a positive electrode and a negative electrode which face each other, and a light emitting layer which is made of a light emitting organic substance and formed between the positive electrode and the negative electrode.

The organic light emitting device used for the organic light emitting apparatus is one of the various organic devices, and the organic light emitting device is manufactured to be very thin by performing a thermal evaporation process on a thin film having a thickness of several hundreds of nanometers. For this reason, to provide an organic light emitting device in the related art on a material surface, it is necessary to select a material, which has a material surface with very low surface roughness at a level of several nanometers or to perform an additional complicated process of flattening a material surface. Further, because the thermal evaporation process needs to be performed on the material surface to provide the organic light emitting device in the related art on the material surface, the organic light emitting device may be provided only on a heat-resistant material which is not deformed even by the thermal evaporation process. Therefore, a material and a shape, which may be applied to manufacture the organic light emitting device, are very limited.

Because of these problems, there is a problem in that the process time and the manufacturing costs are increased to manufacture the organic light emitting devices having various materials or various shapes. In addition, because the organic light emitting device is generally vulnerable to moisture and oxygen, it is necessary to form a multilayer encapsulation film on a lower surface of the organic light emitting device as well as an upper surface of the organic light emitting device. Moisture permeability varies depending on materials on which the organic light emitting devices are formed. Therefore, if the multilayer encapsulation film is formed only on the upper surface of the organic light emitting device and the organic light emitting device is formed on a material having high moisture permeability, there is a problem in that the moisture, which permeates into the material, may shorten a lifespan of the organic light emitting device. Therefore, in the related art, there is a problem in that a large amount of manufacturing process time is generally required because a process of forming a multilayer encapsulation film on a substrate, forming an organic light emitting device, and then forming a multilayer encapsulation film on the organic light emitting device again needs to be performed to form the multilayer encapsulation film even on the lower surface of the organic light emitting device. Further, there is a problem in that the organic light emitting device having a protective film manufactured by the above-mentioned processes has a limitation in terms of durability and reliability associated with mechanical stress such as bending and warping because a neutral axis is positioned to be closer to the substrate than the organic light emitting device. Therefore, there is a problem in that the organic light emitting device has a low ability of withstanding mechanical stress such as bending and scratches that may occur during a process of washing the material to which the organic light emitting device manufactured by the general process is attached after attaching the organic light emitting device to the material.

That is, as described above, there is a problem in that there is a great limitation in applying the organic light emitting device in the related art to application fields associated with wearable, healthcare, and illumination in addition to the application field associated with the flat panel display.

BRIEF SUMMARY OF THE INVENTION

An object of the present invention is to solve the above-mentioned problems and other problems.

Another object of the present invention is to provide an organic device having a protective film, which may be formed on various materials regardless of types of materials, and a method of manufacturing the same.

Still another object of the present invention is to provide an organic device having a protective film which has high durability that may allow the organic device to withstand well physical impact such as bending or warping, and a method of manufacturing the same.

To achieve the above-mentioned objects or other objects, one aspect of the present invention provides a method of manufacturing an organic device having a protective film, the method including: providing bonding layers (adhesives) on one surface of a first substrate and one surface of a second substrate; providing an organic device on the other surface of the first substrate; and providing the second substrate on the organic device such that the bonding layer provided on the second substrate is in contact with the organic device.

According to another aspect of the present invention, the method may further include providing encapsulation film layers (barriers) on the other surface of the first substrate and the other surface of the second substrate before the providing of the organic device on the other surface of the first substrate.

Still another aspect of the present invention provides an organic device having a protective film, the organic device including: bonding layers (adhesives) which are provided on one surface of a first substrate and one surface of a second substrate; and an organic device which is provided on the other surface of the first substrate, in which the second substrate is provided such that the bonding layer of the second substrate is in contact with the organic device.

Since the organic device having the protective film according to the present invention may be attached to other materials through the bonding layer, it is not necessary to apply heat in order to attach the organic device to other materials, and as a result, it is possible to attach the organic device to various materials having various shapes regardless of types and shapes of materials.

According to the organic device having the protective film according to the present invention, since the protective film is formed as the substrate having the bonding layer is attached to the organic device, no heat is applied to the organic device during the process of forming the protective film, and as a result, it is possible to minimize deformation of the organic device by minimizing physical and chemical stress to be applied to the organic device.

According to the organic device having the protective film according to the present invention, the two protective film layers for protecting the organic device are manufactured through the same process, and as a result, it is possible to innovatively reduce the process time required to manufacture the organic device having the protective film in comparison with the process in the related art.

The substrate having upper/lower protective films has a sandwich structure and defines a structure for protecting the organic device, such that a neutral axis is naturally formed on the organic device, and as a result, it is possible to minimize bending stress to be applied to the organic device.

BRIEF DESCRIPTION OF THE DRAWINGS

FIGS. 7 to 11 are views illustrating a process of manufacturing the organic device having the protective film according to another exemplary embodiment of the present invention.

DETAILED DESCRIPTION OF THE INVENTION

Figure 1:
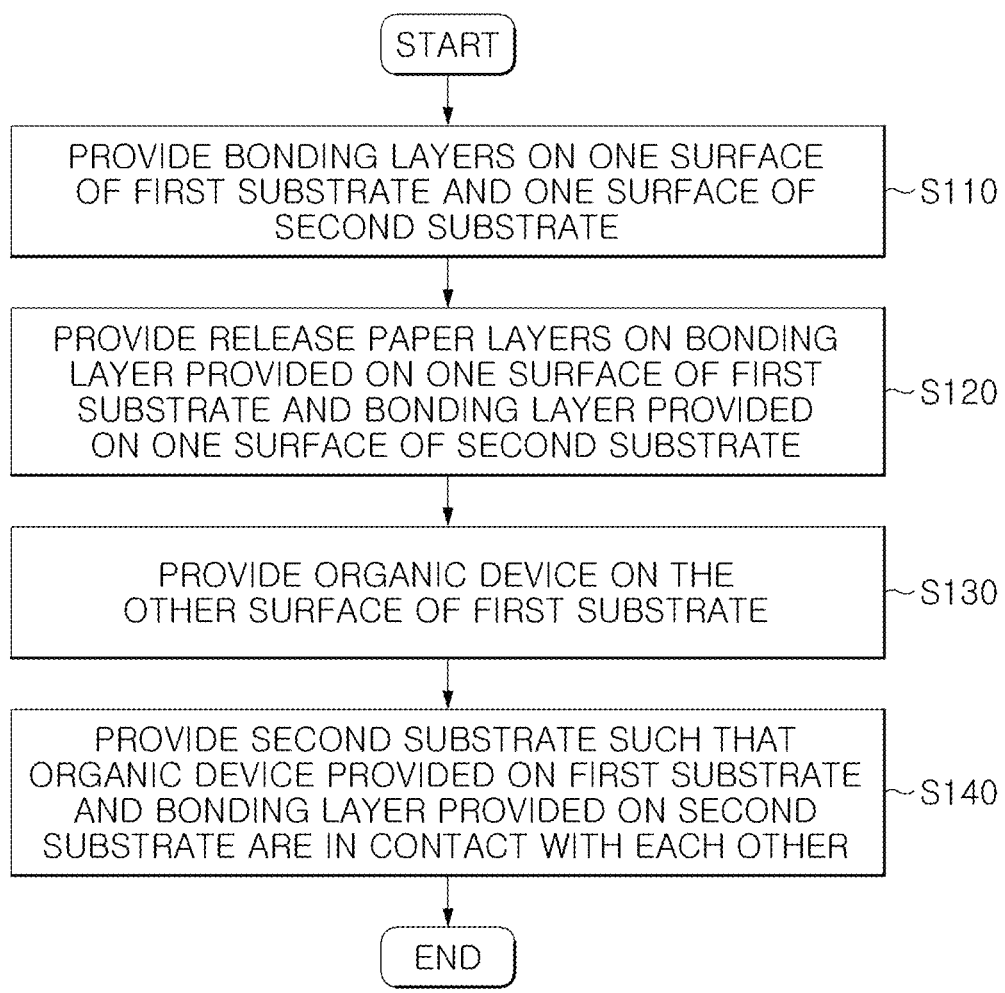
FIG. 1 is a flowchart illustrating a method of manufacturing an organic device having a protective film according to an exemplary embodiment of the present invention.

Hereinafter, exemplary embodiments disclosed in the present specification will be described in detail with reference to the accompanying drawings. The same or similar constituent elements are assigned with the same reference numerals regardless of reference numerals, and the repetitive description thereof will be omitted. In the description of the exemplary embodiments disclosed in the present specification, the specific descriptions of publicly known related technologies will be omitted when it is determined that the specific descriptions may obscure the subject matter of the exemplary embodiments disclosed in the present specification. In addition, it should be interpreted that the accompanying drawings are provided only to allow those skilled in the art to easily understand the exemplary embodiments disclosed in the present specification, and the technical spirit disclosed in the present specification is limited by the accompanying drawings, and includes all alterations, equivalents, and alternatives that are included in the spirit and the technical scope of the present invention.

When one constituent element is described as being "connected" or "coupled" to another constituent element, it should be understood that one constituent element can be connected or coupled directly to another constituent element, and an intervening constituent element can also be present between the constituent elements. When one constituent element is described as being "connected directly to" or "coupled directly to" another constituent element, it should be understood that no intervening constituent element is present between the constituent elements.

Singular expressions include plural expressions unless clearly described as different meanings in the context.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

FIG. 1 is a flowchart illustrating a method of manufacturing an organic device having a protective film according to an exemplary embodiment of the present invention.

FIGS. 2 to 5 are views illustrating a process of manufacturing the organic device having the protective film according to the exemplary embodiment of the present invention.

Figure 2:
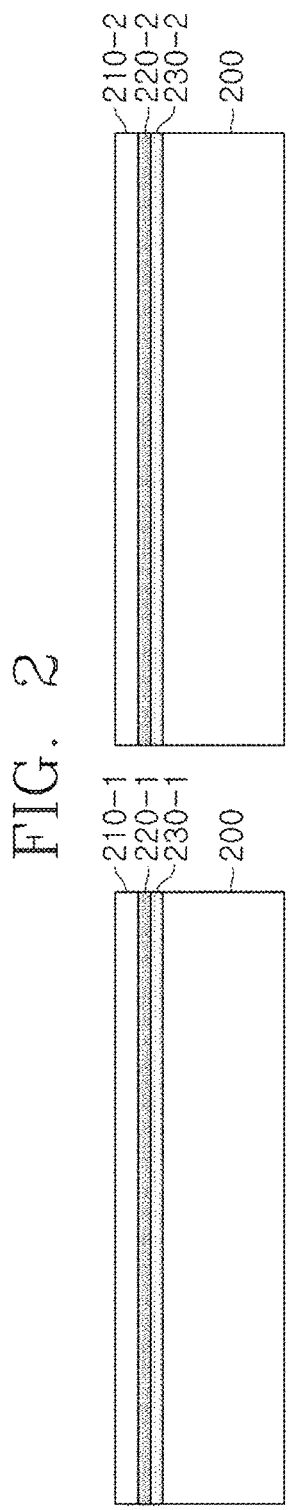
FIGS. 2 to 5 are views illustrating a process of manufacturing the organic device having the protective film according to the exemplary embodiment of the present invention.

Hereinafter, the method of manufacturing the organic device having the protective film will be described in more detail with reference to FIGS. 1 to 5. In FIG. 2, a bonding layer (adhesive) 220 may be formed on one surface of a substrate (S110). The substrate may be a polymer substrate that may be used to manufacture an organic device 300 and made of polyethersulphone (PES), polyacrylate (PAR), polyetherimide (PEI), polyethylene naphthalate (PEN), polyethyelene terepthalate (PET), polyphenylene sulfide (PPS), polyallylate, or polyimide. A thickness of the substrate may be 1 μm to 500 μm, and the thickness of the substrate may vary in consideration of a material to which a finally completed organic device having a protective film is to be attached. Further, a first substrate 210-1 and a second substrate 210-2 may be manufactured to have an equal thickness, but the first substrate 210-1 and the second substrate 210-2 may be manufactured to have different thicknesses in consideration of a material to which the finally completed organic device having the protective film is to be attached.

A release paper layer (liner) 230 may be provided on the substrate having the bonding layer (adhesive) 220 so as to be in contact with the bonding layer (adhesive) 220 (S120). The substrate having the bonding layer (adhesive) 220 may be easily attached to other materials. The release paper layer (liner) 230 may serve to protect the bonding layer (adhesive) 220 so that bonding force of the bonding layer (adhesive) 220 formed on the substrate may be maintained.

The substrate and the bonding layer (adhesive) 220 and the release paper layer (liner) 230, which are formed on one surface of the substrate, may be provided such that the release paper layer (liner) 230, the bonding layer (adhesive) 220, and the substrate are formed in this order on a guide glass 200.

The first substrate 210-1 and the second substrate 210-2, each of which has the bonding layer (adhesive) 220 and the release paper layer (liner) 230, may be formed as the same substrate through a single process and then cut and divided into the first substrate 210-1 and the second substrate 210-2, or the first substrate 210-1 and the second substrate 210-2 may be individually produced through separate processes in a case in which the first substrate 210-1 and the second substrate 210-2 need to be formed to have different thicknesses.

Figure 3:
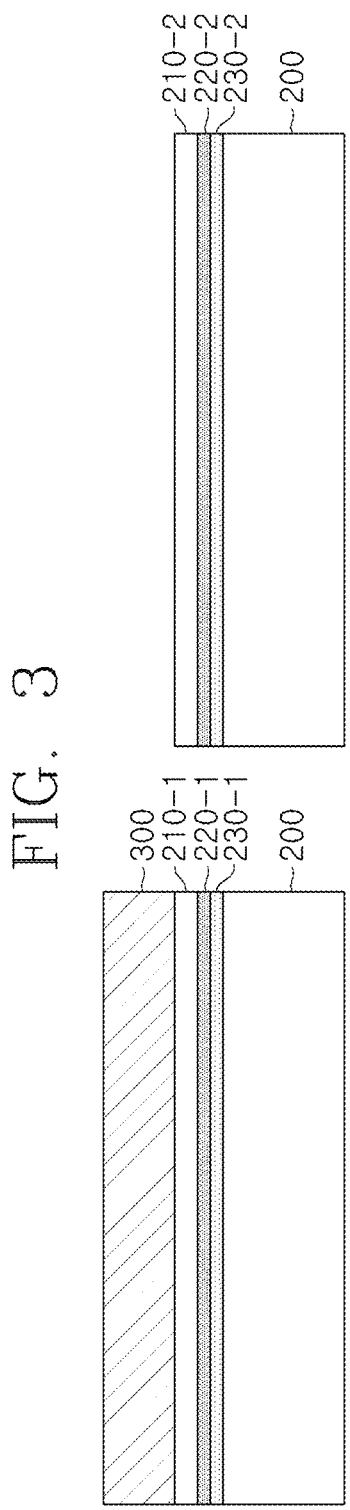

Referring to FIG. 3, the organic device 300 may be provided on the other surface of the first substrate 210-1 (S130).

The organic device 300 is a device including organic molecules, and as an example, the organic device 300 may be an organic light emitting device (OLED). There are various methods of providing the organic device 300, and as an example, the organic device 300 may be provided by a thermal evaporation process.

Figure 4:
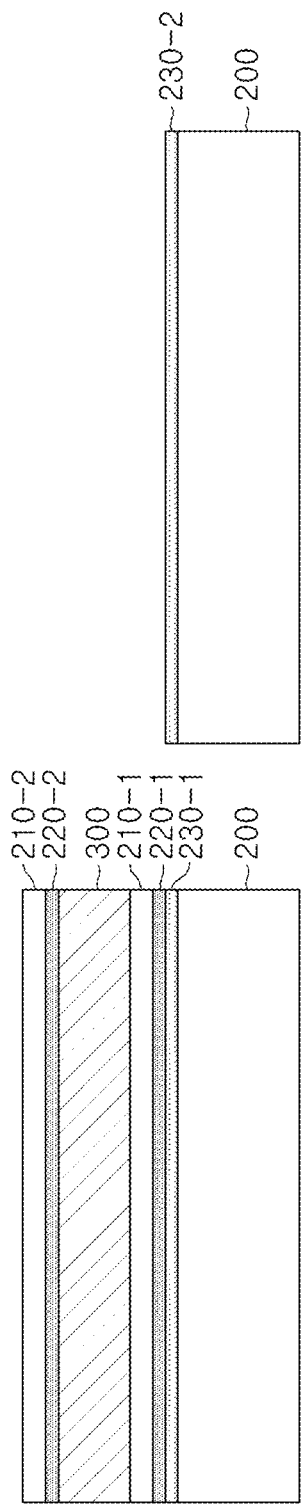

Referring to FIG. 4, the second substrate 210-2 may be provided such that the organic device 300 provided on the first substrate 210-1 and the bonding layer (adhesive) 220 provided on the second substrate 210-2 are in contact with each other (S140).

The organic device 300 may be provided on the other surface of the first substrate 210-1, and then the second substrate 210-2 may be provided on the organic device 300.

The second substrate 210-2 may include the bonding layer, but the second substrate 210-2 may be provided in a state in which a release paper is removed. The bonding layer (adhesive) 220 may be provided to be in contact with the organic device 300 on the second substrate 210-2 on which the bonding layer (adhesive) 220 is provided. In this step, the second substrate 210-2 may be provided on the organic device 300 by using the bonding layer (adhesive) 220 already provided on the second substrate 210-2 without performing a particular process or treatment on the organic device 300 or the second substrate 210-2, and as a result, it is possible to provide the second substrate 210-2 without causing physical and chemical damage to the organic device 300.

Figure 5:
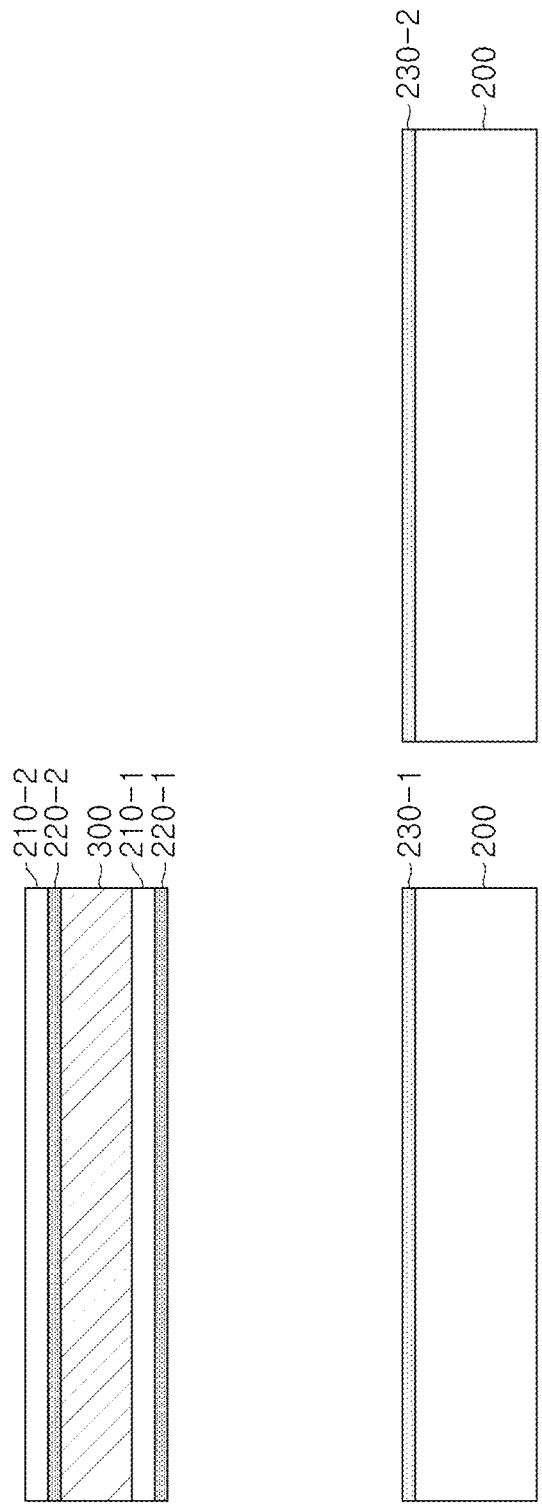

FIG. 5 illustrates the organic device having the protective film.

The organic device having the protective film has a sandwich structure in which the organic device 300 is formed between the first substrate 210-1 and the second substrate 210-2. The bonding layer (adhesive) 220 provided on the first substrate 210-1 may be separated from the release paper layer (liner) 230 and then freely attached (transferred) to other materials. Therefore, it is not necessary to apply heat or pressure in order to attach the organic device having the protective film to another material, and as a result, it is possible to safely attach the organic device without causing physical and chemical damage to the organic device 300 and the material to which the organic device having the protective film is to be attached.

Because of the sandwich structure in which the organic device 300 is disposed between the first substrate 210-1 and the second substrate 210-2, a neutral axis of the organic device having the protective film is naturally formed on the organic device 300, and as a result, it is possible to minimize stress to be applied to the organic device 300.

Figure 6:
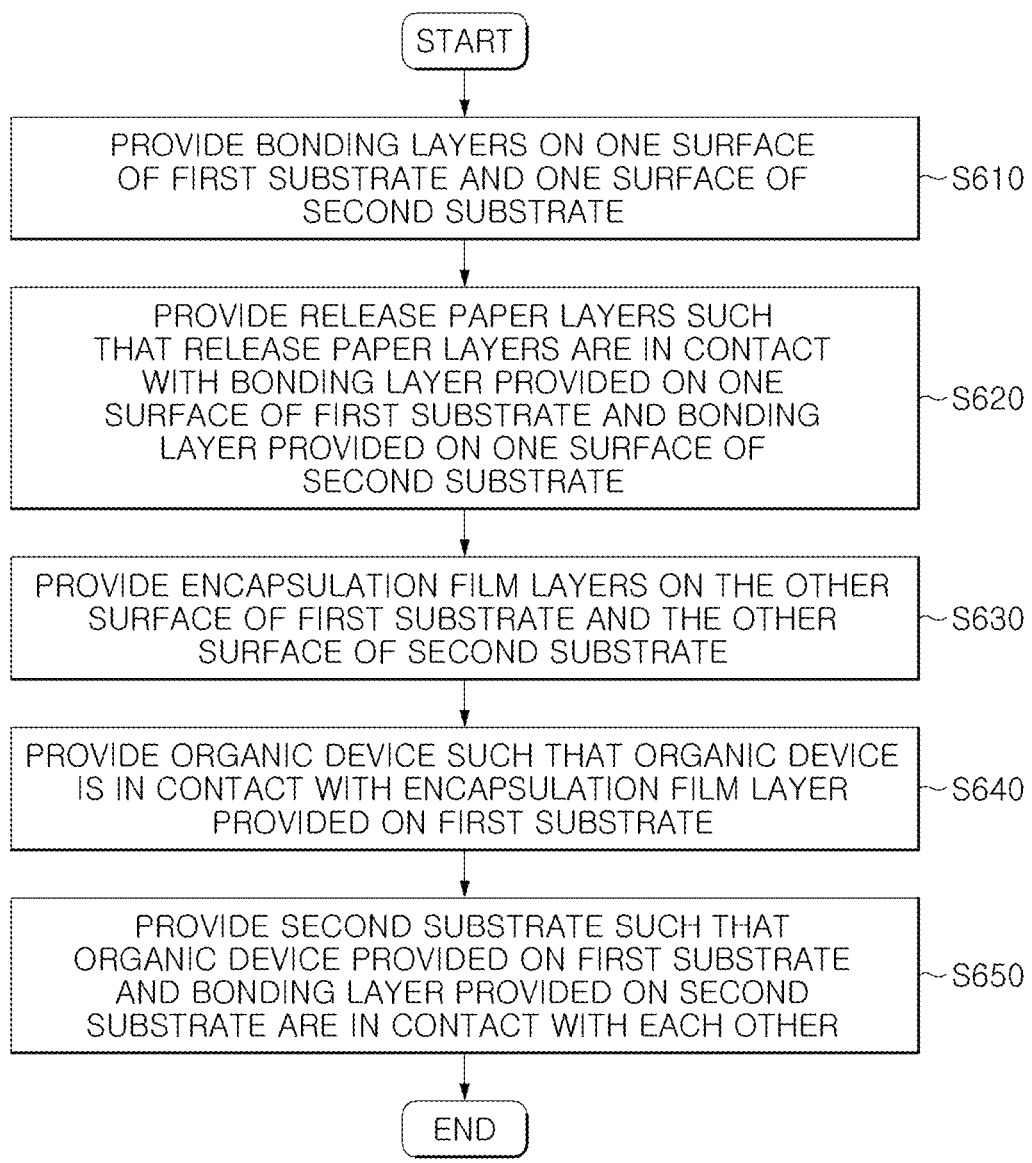
FIG. 6 is a flowchart illustrating a method of manufacturing an organic device having a protective film according to another exemplary embodiment of the present invention.

FIG. 6 is a flowchart illustrating a method of manufacturing an organic device having a protective film according to another exemplary embodiment of the present invention.

FIGS. 7 to 11 are views illustrating a process of manufacturing the organic device having the protective film according to another exemplary embodiment of the present invention.

Figure 7:
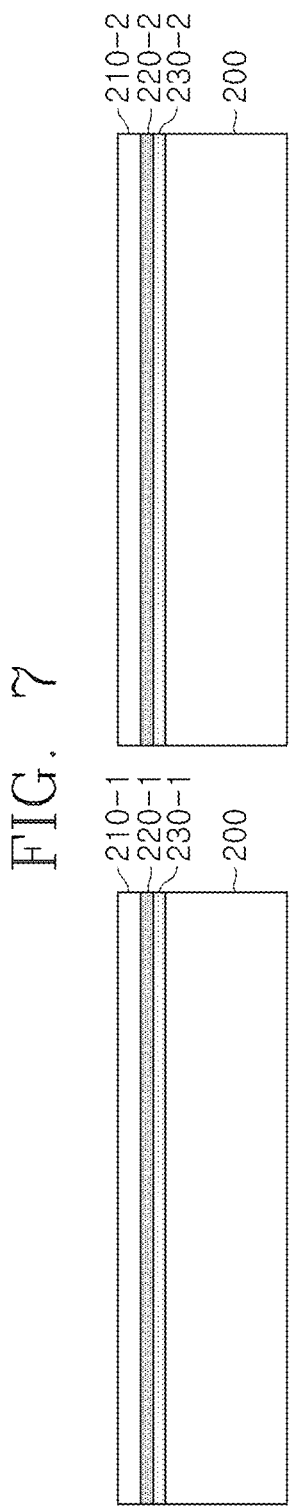

Hereinafter, a method of manufacturing the organic device having the protective film will be described in more detail with reference to FIGS. 6 to 11. In FIG. 7, a bonding layer (adhesive) 220 may be formed on one surface of a substrate (S610). The substrate may be a polymer substrate that may be used to manufacture an organic device 300 and made of polyethersulphone (PES), polyacrylate (PAR), polyetherimide (PEI), polyethylene naphthalate (PEN), polyethyelene terepthalate (PET), polyphenylene sulfide (PPS), polyallylate, or polyimide. A thickness of the substrate may be 1 μm to 500 μm, and the thickness of the substrate may vary in consideration of a material to which a finally completed organic device having a protective film is to be attached. Further, a first substrate 210-1 and a second substrate 210-2 may be manufactured to have an equal thickness, but the first substrate 210-1 and the second substrate 210-2 may be manufactured to have different thicknesses in consideration of a material to which the finally completed organic device having the protective film is to be attached.

A release paper layer (liner) 230 may be provided on the substrate having the bonding layer (adhesive) 220 so as to be in contact with the bonding layer (adhesive) 220 (S620). The substrate having the bonding layer (adhesive) 220 may be easily attached to different materials. The release paper layer (liner) 230 may serve to protect the bonding layer (adhesive) 220 so that bonding force of the bonding layer (adhesive) 220 formed on the substrate may be maintained.

The substrate and the bonding layer (adhesive) 220 and the release paper layer (liner) 230, which are formed on one surface of the substrate, may be provided such that the release paper layer (liner) 230, the bonding layer (adhesive) 220, and the substrate are formed in this order on a guide glass 200.

Figure 8:
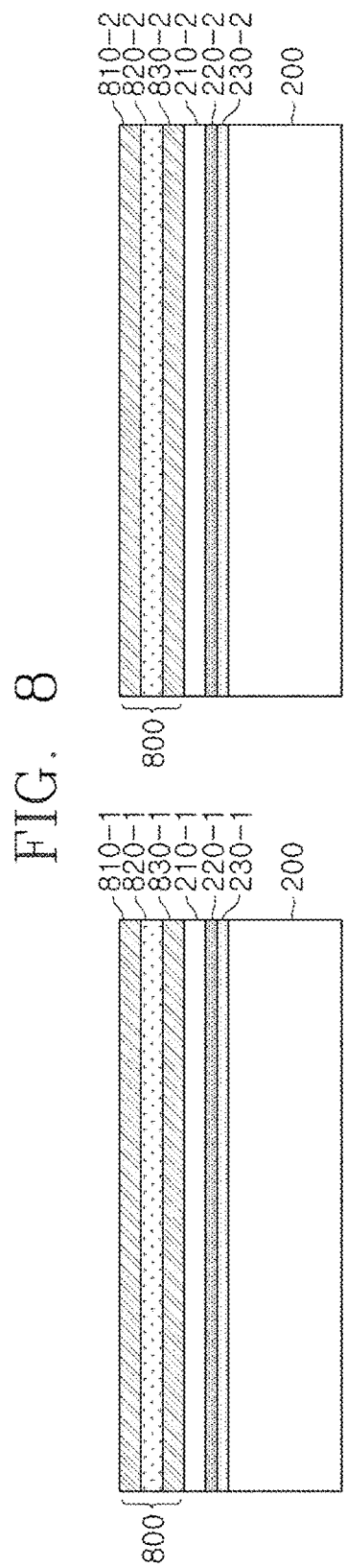

Referring to FIG. 8, a encapsulation film layer (barrier) 800 may be provided on the other surface of the substrate 210 (S630).

The encapsulation film layer (barrier) 800 may be made of a material that may protect the organic device 300 from oxygen and water. Therefore, the encapsulation film layer (barrier) 800 may include an inorganic thin film layer. The inorganic thin film layer may be made of any one of $Al_2O_3$, ZnO, $ZrO_2$, $TiO_2$, MgO, $WO_3$, ZnS, $Y_2O_3$, $HfO_2$, $SiO_2$, SiNx, and AlN. A thickness of the inorganic thin film layer may be 1 nm to 1 μm. Further, the encapsulation film layer may further include an organic thin film layer. The encapsulation film layer (barrier) 800 may be structured such that the organic thin film layer is included between the two inorganic thin film layers. The encapsulation film layer (barrier) 800 may be provided on the other surface of the substrate 210 by using chemical vapor deposition, sputtering, ion beam deposition, or electron beam deposition.

The first substrate 210-1 and the second substrate 210-2, each of which has the bonding layer (adhesive) 220, the release paper layer (liner) 230, and the encapsulation film layer (barrier) 800, may be formed through a single process and then cut and divided into the first substrate 210-1 and the second substrate 210-2 each having the bonding layer (adhesive) 220, the release paper layer (liner) 230, and the encapsulation film layer (barrier) 800, or the first substrate 210-1 and the second substrate 210-2 may be individually produced through separate processes in a case in which the first substrate 210-1 and the second substrate 210-2 need to be formed to have different thicknesses.

Figure 9:
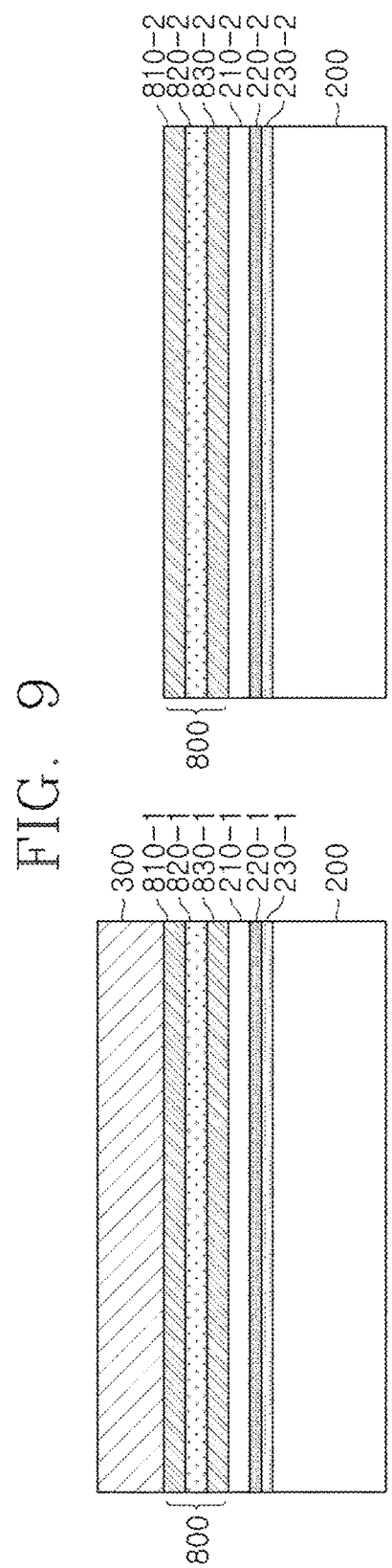

Referring to FIG. 9, the organic device 300 may be provided to be in contact with the encapsulation film layer (barrier) 800 provided on the first substrate 210-1 (S640).

The organic device 300 is a device including organic molecules, and as an example, the organic device 300 may be an organic light emitting device (OLED). There are various methods of providing the organic device 300, and as an example, the organic device 300 may be provided by a thermal evaporation process.

Figure 10:
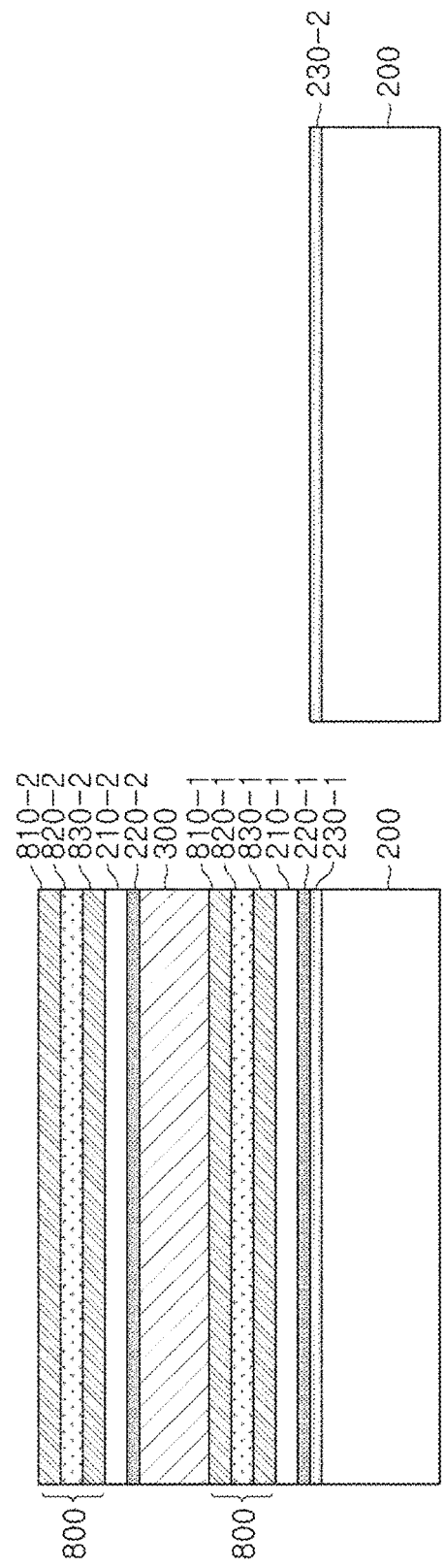

Referring to FIG. 10, the second substrate 210-2 may be provided such that the organic device 300 provided on the first substrate 210-1 and the bonding layer (adhesive) 220 provided on the second substrate 210-2 are in contact with each other (S650).

The encapsulation film layer (barrier) 800 and the organic device 300 may be provided on the other surface of the first substrate 210-1, and then the second substrate 210-2 may be provided. The second substrate 210-2 may be provided in a state in which the release paper is removed. The bonding layer (adhesive) 220 may be provided to be in contact with the organic device 300 on the second substrate 210-2 on which the bonding layer (adhesive) 220 and the encapsulation film layer (barrier) 800 are provided. In this step, the second substrate 210-2 may be provided on the organic device 300 by using the bonding layer (adhesive) 220 already provided on the second substrate 210-2 without performing a particular process or treatment on the organic device 300 or the second substrate 210-2, and as a result, it is possible to provide the second substrate 210-2 without causing physical and chemical damage to the organic device 300. Further, it is possible to reduce the number of processes and time because the first substrate 210-1 and the second substrate 210-2 are manufactured through the same process, and it is possible to reduce the process time by 30% or more in comparison with a process of forming a protective film on an organic device in the related art.

According to the method of manufacturing the organic device having the protective film according to the exemplary embodiment of the present invention, there is an effect of reducing process costs and process time in comparison with a process of forming a protective film on an organic device in the related art, and this effect will be described quantitatively.

To form the protective film on the organic device in the related art, it takes about 9 hours to perform a process of forming a first encapsulation film layer (barrier) on one surface of a substrate, about 3 hours to perform a process of forming an organic device on the first encapsulation film layer (barrier), and about 9 hours to form a second encapsulation film layer (barrier) on the organic device, such that a total of 21 hours are required. Further, a process facility for forming the first encapsulation film layer (barrier) and a process facility for forming the second encapsulation film layer (barrier) need to be independently provided.

However, according to the method of manufacturing the organic device having the protective film according to the exemplary embodiment of the present invention, the first encapsulation film layer (barrier) 800 and the second encapsulation film layer (barrier) 800 are formed on the first substrate 210-1 and the second substrate 210-2 through the same process, and as a result, the process time is about 9 hours. Further, it takes about 3 hours to form the organic device on the first encapsulation film layer (barrier) 800, and then all of the processes are completed as the second substrate 210-2 having the second encapsulation film layer (barrier) 800 is just attached to the organic device, and as a result, a total of 12 hours are required. Therefore, there is an effect of reducing the process time by about 42.8% in comparison with the process time in the related art. Further, because the first substrate 210-1 having the first encapsulation film layer (barrier) 800 and the second substrate 210-2 having the second encapsulation film layer (barrier) 800 are substantially the same substrate, it is not necessary to install independent process facilities, and the first substrate 210-1 having the first encapsulation film layer (barrier) 800 and the second substrate 210-2 having the second encapsulation film layer (barrier) 800 may be manufactured by the same facility, and as a result, it is possible to reduce costs in terms of establishing the process facility.

FIG. 11 illustrates the organic device having the protective film.

The organic device having the protective film has a sandwich structure in which the organic device 300 is formed between the first substrate 210-1 and the second substrate 210-2. The bonding layer (adhesive) 220 provided on the first substrate 210-1 may be separated from the release paper layer (liner) 230 and then freely attached (transferred) to other materials. Therefore, it is not necessary to apply heat or pressure in order to attach the organic device having the protective film to another material, and as a result, it is possible to safely attach the organic device without causing physical and chemical damage to the organic device 300 and the material to which the organic device having the protective film is to be attached.

Because of the sandwich structure in which the organic device 300 is disposed between the first substrate 210-1 and the second substrate 210-2, a neutral axis of the organic device having the protective film is naturally formed on the organic device 300, and as a result, it is possible to minimize stress to be applied to the organic device 300.

Further, the organic device 300 may be blocked and protected from oxygen and moisture by the encapsulation film layers (barriers) 800 provided on the first substrate 210-1 and the second substrate 210-2.

Figure 12:
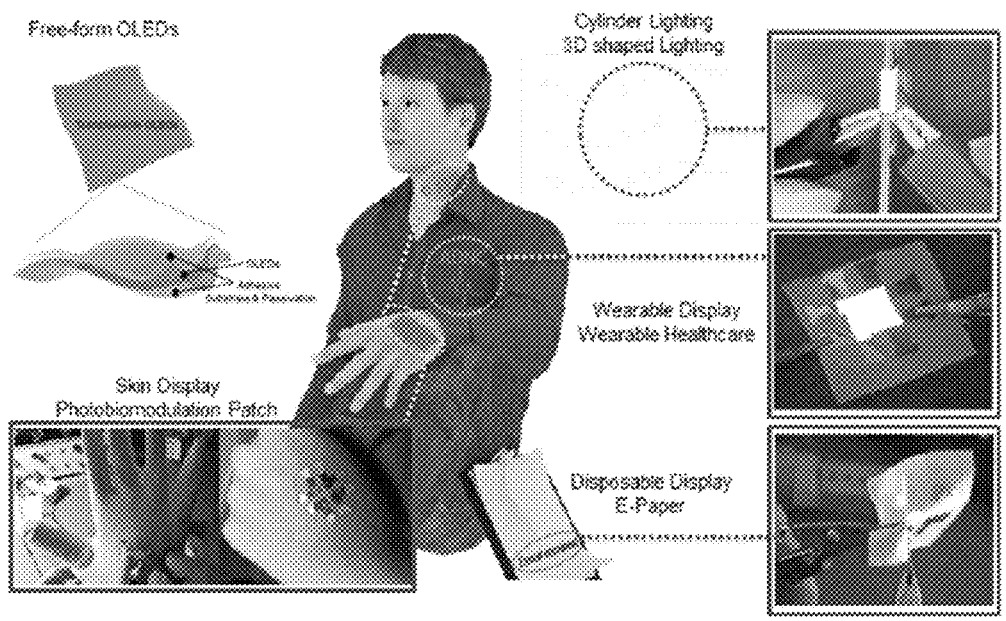
FIG. 12 is a view illustrating various examples in which the organic device having the protective film according to the exemplary embodiment of the present invention is utilized.

FIG. 12 is a view illustrating various examples in which the organic device having the protective film according to the exemplary embodiment of the present invention is utilized.

Referring to FIG. 12, it can be seen that organic light emitting devices (OLEDs) having protective films are provided on the skin, a cylinder, clothes, or paper. As described above, the organic device having the protective film according to the present invention may be attached to various materials regardless of types or shape of materials to which the organic device is to be attached. Therefore, the organic device having the protective film according to the present invention may be used in various fields such as wearable, health care, illumination, or E-paper fields.

FIG. 13 is a view illustrating properties of the organic device having the protective film according to the exemplary embodiment of the present invention before/after the device is transferred.

Figure 13A:
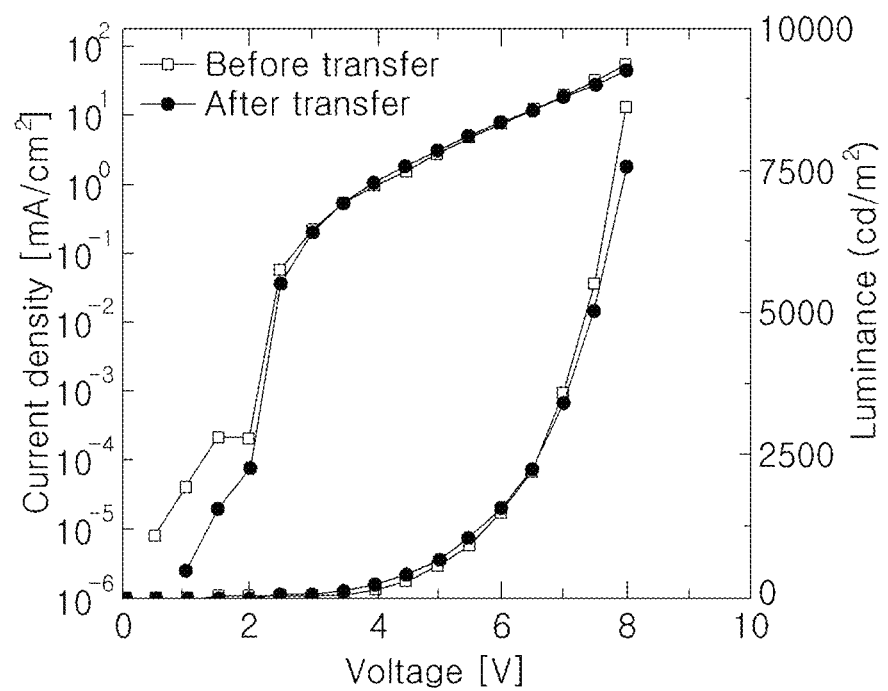
FIGS. 13A and 13B are views illustrating properties of the organic device having the protective film according to the exemplary embodiment of the present invention before/after the device is transferred.
Figure 13B:
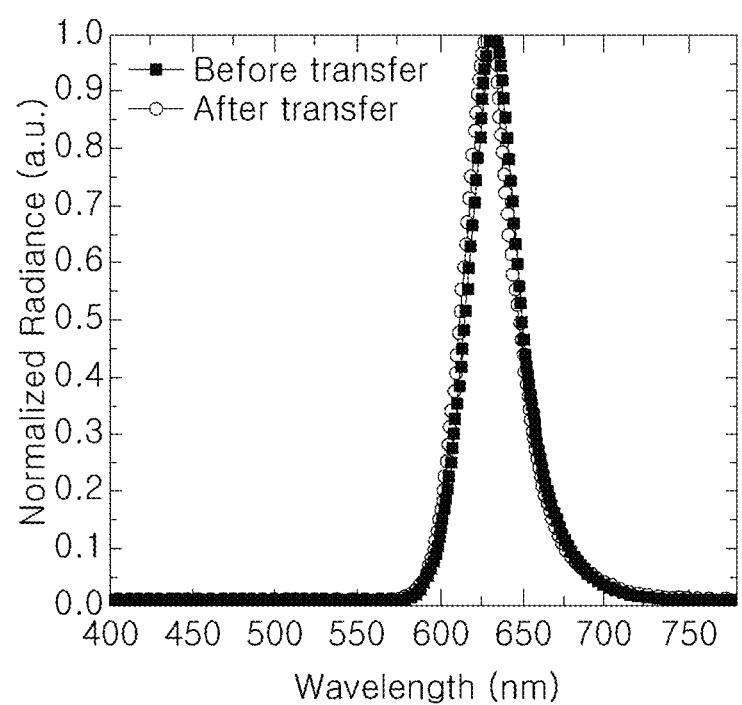

Referring to FIG. 13, there is a likelihood that physical damage may occur during the process of attaching the organic light emitting device (OLED) having the protective film according to the present invention to a target material, or a performance of a product may deteriorate after the attachment. However, as illustrated in FIG. 13A, it can be seen that there is not a great change in performance before/after the attachment as a result of measuring current density with respect to voltage and luminance with respect to voltage. Further, referring to FIG. 13B, it can be seen that there is not a great change in performance before/after the attachment as a result of measuring normalized radiance with respect to wavelength.

Figure 14:
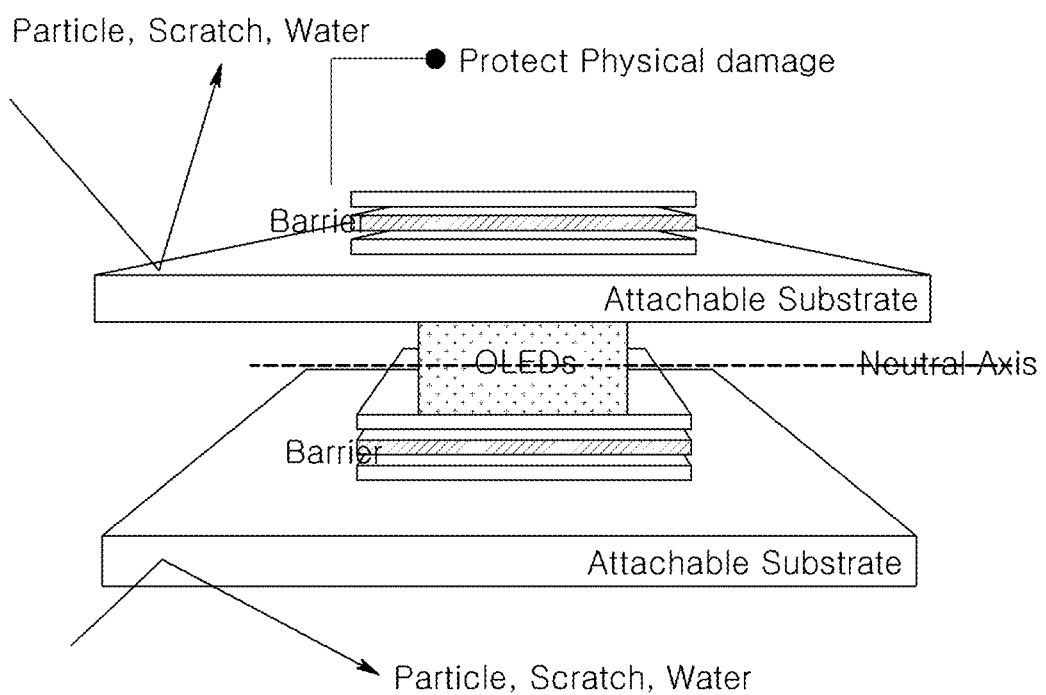
FIG. 14 is a view illustrating a bending neutral axis of the organic device having the protective film according to the exemplary embodiment of the present invention.

FIG. 14 is a view illustrating a bending neutral axis of the organic device having the protective film according to the exemplary embodiment of the present invention.

FIG. 14 illustrates a state in which protective films (barriers) are formed on substrates (attachable substrates) having two bonding layers (adhesives) 220, and organic light emitting devices (OLEDs) are sandwiched between the substrates having the bonding layer (adhesive) 220 and the protective film. With this structure, the neutral axis the neutral axis is naturally positioned on the organic light emitting devices (OLEDs) without applying structural deformation so as for the neutral axis to be positioned on the organic light emitting devices (OLEDs), and as a result, it is possible to minimize stress to be applied to the organic light emitting devices (OLEDs).

FIG. 15 is a graph illustrating a stress degree of the organic device having the protective film according to the exemplary embodiment of the present invention.

Figure 15A:
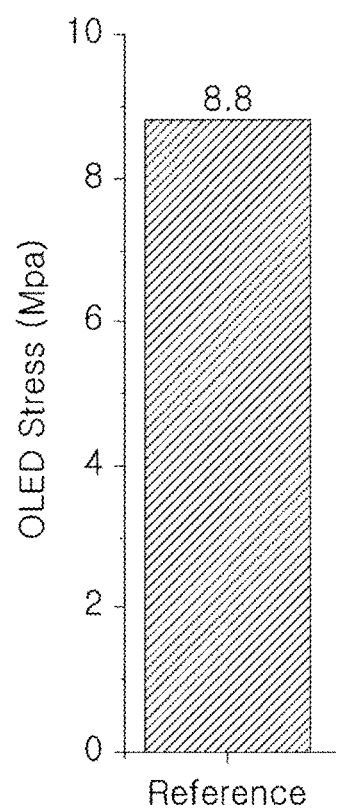
FIGS. 15A, 15B, 15C, and 15D are graphs illustrating a stress degree of the organic device having the protective film according to the exemplary embodiment of the present invention.
Figure 15B:
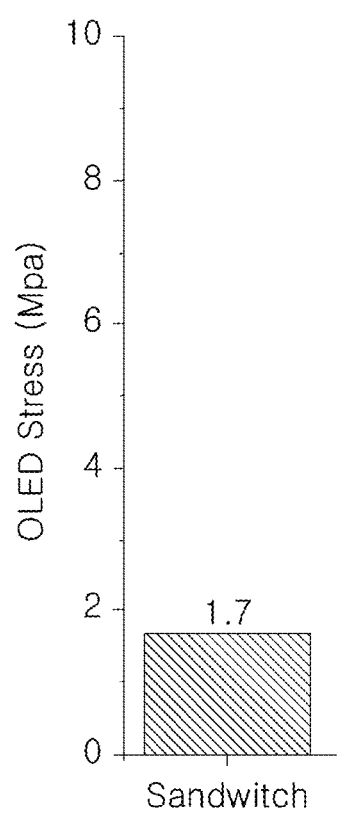
Figure 15C:
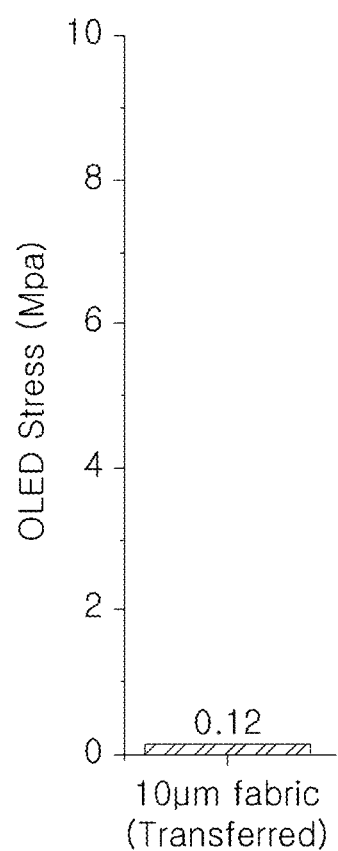
Figure 15D:
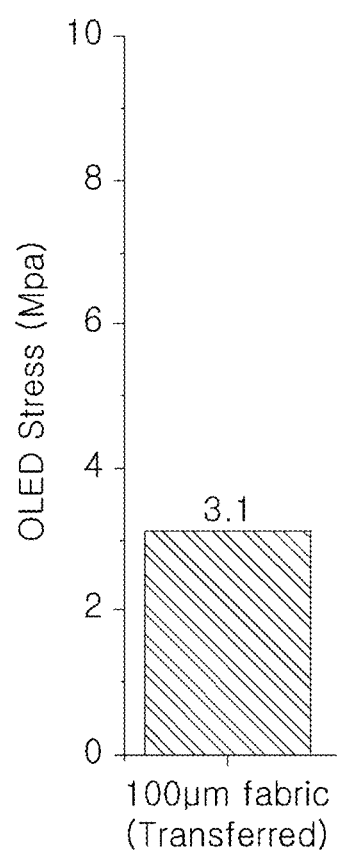

Referring to FIG. 15, FIG. 15A illustrates that a stress degree caused by bending or warping of the organic light emitting device (OLED) in the related art is measured as about 8.8 MPa, but FIG. 15B illustrates that a stress degree of the organic light emitting device (OLED) according to the present invention is measured as a very small numerical value of about 1.7 MPa. FIG. 15C illustrates that a stress degree of the organic light emitting device having the protective film according to the present invention, which is attached to a woven fabric having a thickness of 10 μm, is measured as a very small numerical value of 0.12 MPa. Referring to FIG. 15D, it can be seen that a stress numerical value is 3.1 MPa, which is a slightly increased value, in a case in which the organic light emitting device (OLED) having the protective film according to the present invention is attached to a woven fabric having a thickness of 100 μm. Therefore, it can be seen that stress is significantly reduced in the case of the organic light emitting device (OLED) having the protective film in comparison with the organic light emitting device (OLED) in the related art. The stress to be applied to the organic light emitting device (OLED) may be adjusted by adjusting a thickness of the substrate in accordance with types of materials to which the organic light emitting device (OLED) is to be attached.

FIG. 16 is a view illustrating a change in physical properties of the organic device having the protective film according to the exemplary embodiment of the present invention before/after bending stress is applied to the device.

Figure 17:
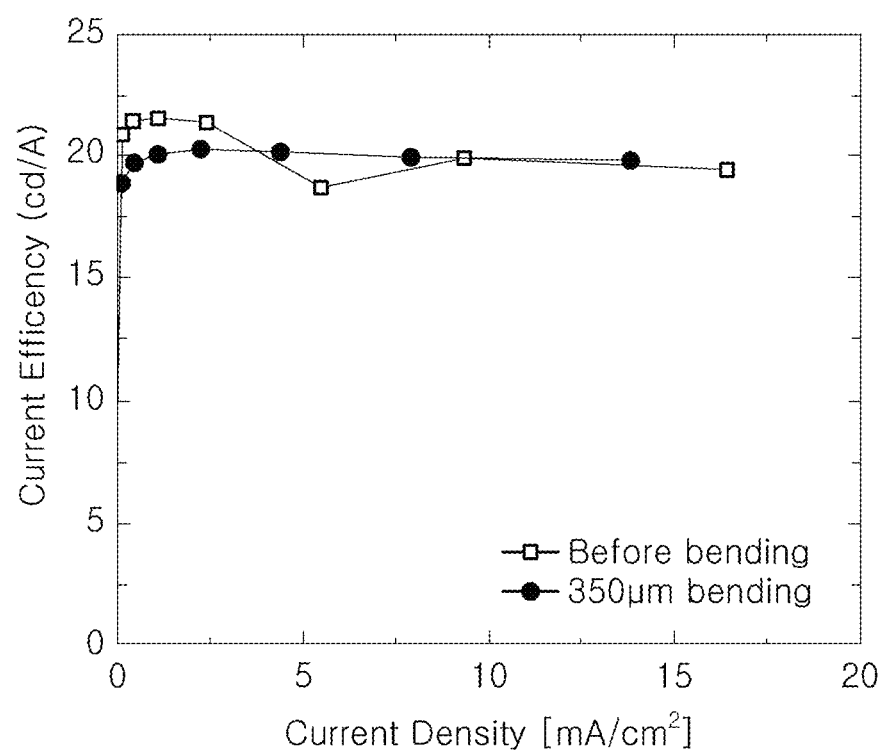
FIG. 17 is a graph illustrating a change in physical properties of the organic device having the protective film according to the exemplary embodiment of the present invention before/after bending stress is applied to the device.

FIG. 17 is a graph illustrating a change in physical properties of the organic device having the protective film according to the exemplary embodiment of the present invention before/after bending stress is applied to the device.

Figure 16A:
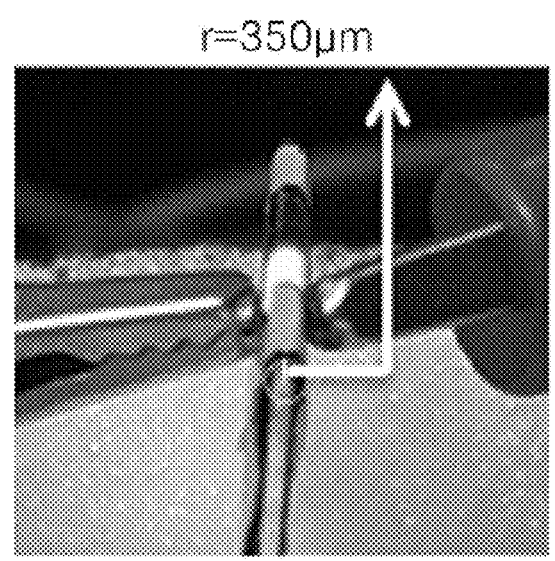
FIGS. 16A and 16B are views illustrating a change in physical properties of the organic device having the protective film according to the exemplary embodiment of the present invention before/after bending stress is applied to the device.
Figure 16B:
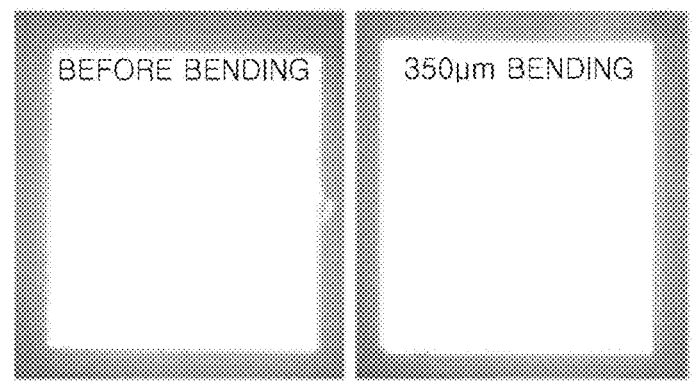

It can be seen that light emitting properties of the organic light emitting device (OLED) are maintained as illustrated in FIG. 16B, in a case in which bending stress is applied to the organic light emitting device (OLED) having the protective film according to the present invention 1,000 times or more with a bending (bending radius r=350 μm) degree equal to a folding level as illustrated in FIG. 16A. Further, referring to FIG. 17, it can be seen that current efficiency with respect to current density remains almost the same before/after bending, such that properties of the device are maintained before/after the bending stress is applied.

Figure 18:
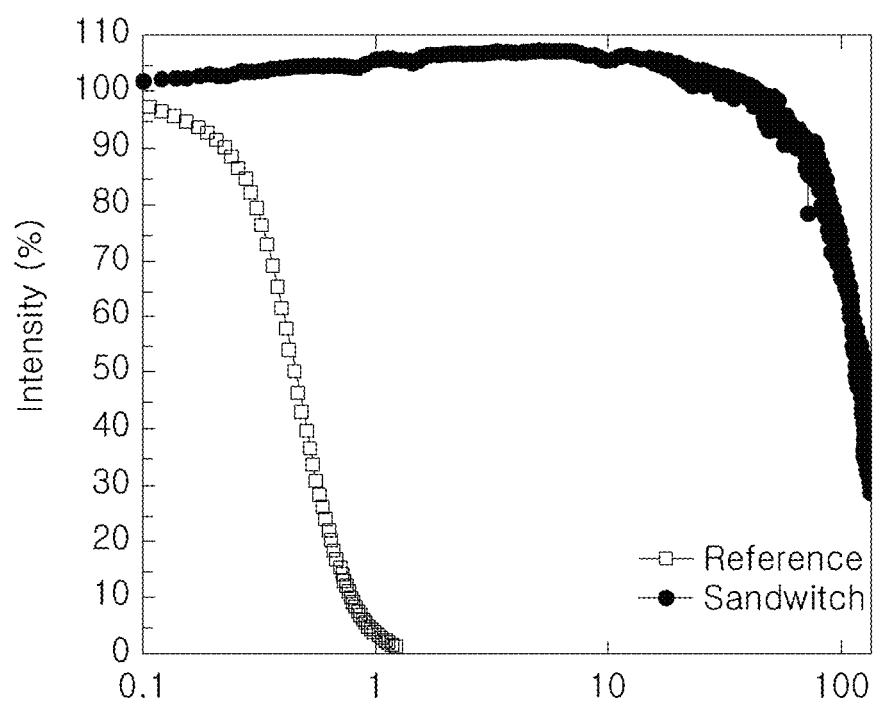
FIG. 18 is a graph illustrating operable time of the organic device having the protective film according to the exemplary embodiment of the present invention.

FIG. 18 is a graph illustrating operable time of the organic device having the protective film according to the exemplary embodiment of the present invention.

Referring to FIG. 18, when comparing operating time of an organic light emitting device (OLED) having no protective film in the related art and operating time of the organic light emitting device (OLED) having the protective film according to the present invention, the operating time of the organic light emitting device (OLED) in the related art is 1 hour, whereas the operating time of the organic light emitting device (OLED) according to the present invention is 100 hours or more, such that there is a great difference therebetween. Because the protective film having the sandwich structure surrounds the organic light emitting device (OLED), the organic light emitting device (OLED) is protected from oxygen and moisture, and as a result, the organic light emitting device (OLED) may safely operate for a long period of time.

FIG. 19 is a graph illustrating whether the organic device 300 having the protective film according to the exemplary embodiment of the present invention is scratched in comparison with an organic device 300 in the related art.

Figure 19A:
FIGS. 19A, 19B, and 19C are views illustrating whether the organic device having the protective film according to the exemplary embodiment of the present invention is scratched in comparison with an organic device in the related art.
Figure 19B:
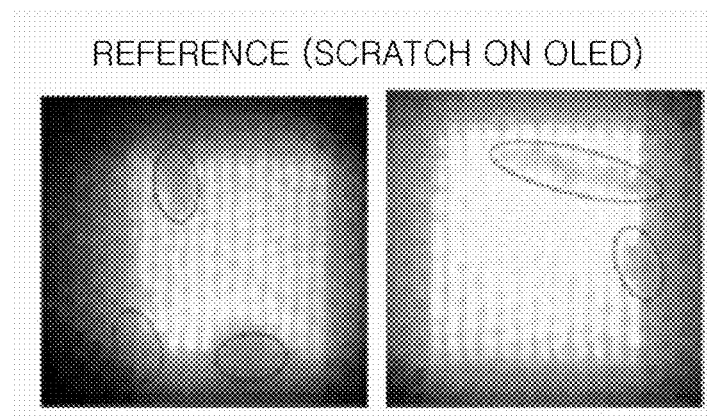
Figure 19C:
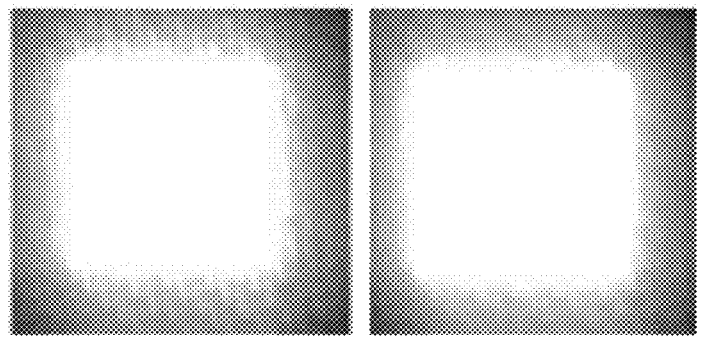

FIG. 19A illustrates that the organic light emitting device (OLED) in the related art and the organic light emitting device (OLED) according to the present invention are compared in terms of performances in a case in which the organic light emitting devices (OLED) are attached to a cloth and then the cloth is washed. Referring to FIG. 19B, it can be seen that a surface of the organic light emitting device (OLED) in the related art is scratched because of the washing process. In contrast, referring to FIG. 19C, it can be seen that original performances and properties of the organic light emitting device (OLED) having the protective film according to the present invention are maintained without scratches.

Figure 20:
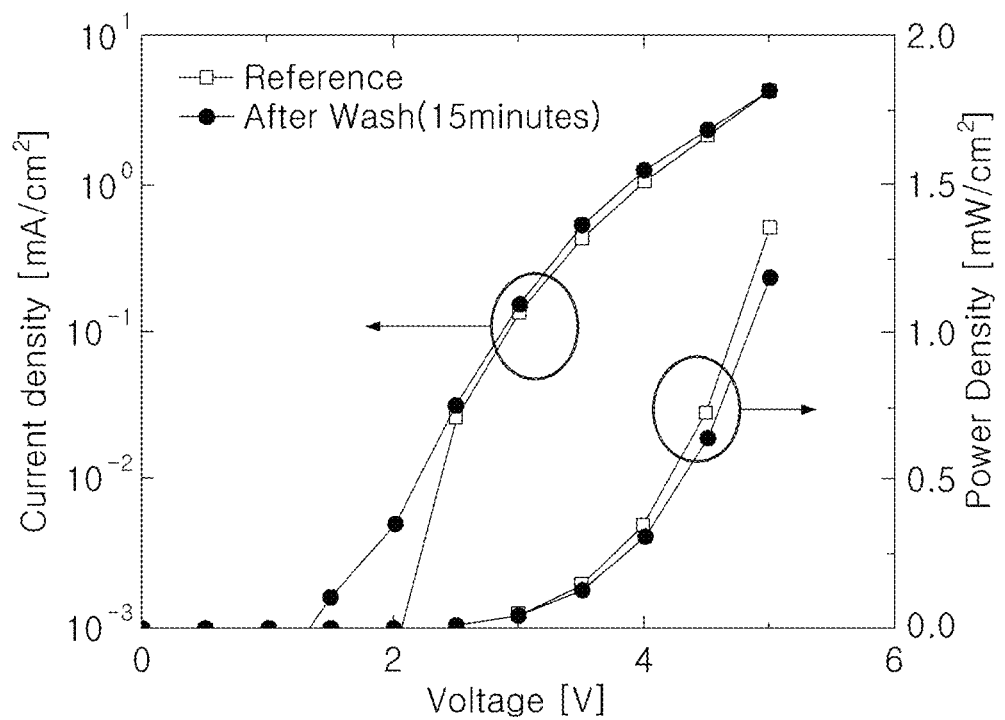
FIG. 20 is a graph illustrating whether the organic device having the protective film according to the exemplary embodiment of the present invention is scratched before/after the organic device is washed.

FIG. 20 is a graph illustrating whether the organic device having the protective film according to the exemplary embodiment of the present invention is scratched before/after the organic device is washed.

FIG. 20 illustrates a graph illustrating a change in properties of the organic light emitting device (OLED) according to the present invention before/after the organic light emitting device (OLED) is washed. It can be seen that electrical properties of the organic light emitting device (OLED) remain similar and there is no great change, before/after the organic light emitting device (OLED) is washed, when checking the power density with respect to the voltage and the current density with respect to the voltage.

These properties are effects obtained because the organic light emitting device (OLED) having the protective film according to the present invention is strong against physical damage since the organic light emitting device (OLED) is protected by the protective film, the organic light emitting device (OLED) is strong against chemical deformation since the organic light emitting device (OLED) is protected from oxygen and moisture, and the organic light emitting device (OLED) is strong against bending or warping since the organic light emitting device (OLED) has the sandwich structure and the neutral axis is positioned closer to the organic light emitting device (OLED).

As described above, since the organic device having the protective film according to the present invention may be attached to other materials through the bonding layer (adhesive) 220, it is not necessary to apply heat in order to attach the organic device to other materials, and as a result, it is possible to attach the organic device to various materials having various shapes regardless of types and shapes of materials.

According to the organic device having the protective film according to the present invention, since the protective film is formed as the substrate having the bonding layer (adhesive) 220 is attached to the organic device 300, no heat is applied to the organic device 300 during the process of forming the protective film, and as a result, it is possible to minimize deformation of the organic device 300 by minimizing physical and chemical stress to be applied to the organic device 300.

According to the organic device having the protective film according to the present invention, the two protective film layers for protecting the organic device 300 are manufactured through the same process, and as a result, it is possible to innovatively reduce the process time required to manufacture the organic device having the protective film in comparison with the process in the related art.

The substrate having upper/lower protective films has a sandwich structure and defines a structure for protecting the organic device, such that a neutral axis is naturally formed on the organic device 300, and as a result, it is possible to minimize bending stress to be applied to the organic device 300.

It is apparent to those skilled in the art that the present invention may be specified as other specific forms without departing from the spirit and the essential features of the present invention.

It should be appreciated that the detailed description is interpreted as being illustrative in every sense, not restrictive. The scope of the present invention should be determined based on the reasonable interpretation of the appended claims, and all of the modifications within the equivalent scope of the present invention belong to the scope of the present invention.

What is claimed is:

1. A method of manufacturing an organic device having a protective film, the method comprising:
    providing bonding layers on one surface of a first substrate and one surface of a second substrate;
    providing a respective release paper layer on each of the bonding layers of the first substrate and the second substrate;
    providing an organic device on the other surface of the first substrate; and
    providing the second substrate on the organic device such that the bonding layer provided on the second substrate is in contact with the organic device, after removing the release paper layer of the second substrate.

2. The method of claim 1, further comprising:
    providing encapsulation film layers on the other surface of the first substrate and the other surface of the second substrate before the providing of the organic device on the other surface of the first substrate.

3. The method of claim 2, wherein the encapsulation film layer includes an inorganic thin film layer.

4. The method of claim 3, wherein the encapsulation film layer further includes an organic thin film layer.

5. The method of claim 4, the organic thin film layer is formed between the two the inorganic thin film layers.

6. The method of claim 3, wherein the inorganic thin film layer is made of any one of $Al_2O_3$, ZnO, $ZrO_2$, $TiO_2$, MgO, $WO_3$, ZnS, $Y_2O_3$, $HfO_2$, $SiO_2$, SiNx, and AN.

7. The method of claim 3, wherein a thickness of the inorganic thin film layer is 1 nm to 1 µm.

8. The method of claim 2, wherein the encapsulation film layer is provided by using chemical vapor deposition, sputtering, ion beam deposition, or electron beam deposition.

9. The method of claim 1, wherein the organic device is an organic light emitting device.

10. The method of claim 1, wherein the first substrate or the second substrate is a polymer substrate.

11. The method of claim 1, wherein a thickness of the first substrate or the second substrate is 1 µm to 500 µm.

12. The method of claim 1, wherein the organic device is provided through a thermal evaporation process.

13. An organic device having a protective film comprising:
    a first bonding layer and a release paper layer which are sequentially formed on one surface of a first substrate;
    an organic device which is provided on the other surface of the first substrate; and
    a second substrate on the organic device, wherein the second substrate is in contact with the organic device through a second bonding layer formed on one surface of the second substrate.

14. The organic device of claim 13, wherein after encapsulation film layers are provided on the other surface of the first substrate and the other surface of the second substrate, the organic device is provided such that the organic device is in contact with the encapsulation film layer provided on the first substrate.

15. The organic device of claim 13, wherein the organic device is an organic light emitting device.

* * * * *

UNITED STATES PATENT AND TRADEMARK OFFICE
CERTIFICATE OF CORRECTION

| | | |
|---|---|---|
| PATENT NO. | : 10,879,489 B2 | Page 1 of 1 |
| APPLICATION NO. | : 16/416576 | |
| DATED | : December 29, 2020 | |
| INVENTOR(S) | : Kyung Cheol Choi et al. | |

It is certified that error appears in the above-identified patent and that said Letters Patent is hereby corrected as shown below:

In the Claims

Column 12, Line 33, Claim 6, delete "AN." and insert -- AlN. --

Signed and Sealed this
Sixteenth Day of March, 2021

Drew Hirshfeld
*Performing the Functions and Duties of the
Under Secretary of Commerce for Intellectual Property and
Director of the United States Patent and Trademark Office*